United States Patent [19]

Mitsuhashi et al.

[11] 4,431,308
[45] Feb. 14, 1984

[54] LASER ANGULAR SPEED DETECTOR EMPLOYING NON-OPTICAL OUTPUT

[75] Inventors: Yoshinobu Mitsuhashi; Junichi Shimada; Kenjiro Sakurai, all of Sakura; Yukinobu Nakamura, Asaka, all of Japan

[73] Assignees: Seiichi Ishizaka, President of Kogyo Gijutsuin; Honda Giken Kogyo Kabushiki Kaisha, both of Tokyo, Japan

[21] Appl. No.: 292,419

[22] Filed: Aug. 13, 1981

[30] Foreign Application Priority Data

Aug. 13, 1980 [JP] Japan .................. 55-110420

[51] Int. Cl.³ .......................... G01C 19/64
[52] U.S. Cl. ...................... 356/350; 372/94
[58] Field of Search .......... 356/350; 372/38, 46, 372/94

[56] References Cited

U.S. PATENT DOCUMENTS 4,258,336 3/1981 Fletcher et al. .................. 372/94

FOREIGN PATENT DOCUMENTS 2852614 6/1979 Fed. Rep. of Germany ..... 356/73.1

Primary Examiner—Vincent P. McGraw
Attorney, Agent, or Firm—Armstrong, Nikaido, Marmelstein and Kubovcik

[57] ABSTRACT

A semiconductor ring laser apparatus is provided which comprises a semiconductor laser element having electrical terminals and optical terminals. An electrical power supply means is coupled to the electrical terminals for applying a voltage thereto and optical means are optically coupled to the optical terminals of the semiconductor laser element. The optical means form resonant ring optical paths in clockwise and counterclockwise directions for the light which is emitted by the semiconductor. Detector means are provided which are coupled to said electrical terminals for detecting voltage variations thereon caused by the rotation of the apparatus.

5 Claims, 8 Drawing Figures

4,431,308

LASER ANGULAR SPEED DETECTOR EMPLOYING NON-OPTICAL OUTPUT

BACKGROUND OF THE INVENTION

1. Field of the Invention

This invention relates to a semiconductor ring laser apparatus used for detecting an angular speed.

2. Description of the Prior Art

There has been hitherto known a helium neon ring laser apparatus such as shown in FIG. 1. In this Figure, a helium neon medium tube 1 is made of quartz or the like, and this medium tube 1 is provided with mirrors 2a, 2b, a beam splitter 3, a prism 4 and electrodes 6,6 connected to a driving electric source 5. An optical detector 8 having an output terminal 7 faces the prism 4.

This apparatus is brought into a ring laser oscillation condition by a ring-formed optical path 9 formed in the helium neon medium tube 1 and used as a ring resonator. A beam in a clockwise direction travels from the mirror 2a towards the beam splitter 3 to penetrate the beam splitter 3 and is then reflected by the prism 4 and travels again towards the beam splitter 3, and is reflected again before that position to reach the optical detector 8, while a beam in a counterclockwise direction travels towards the beam splitter 3 to penetrate the beam splitter 3 and the prism 4 and reaches the optical detector 8.

If now a certain angular speed is applied to the apparatus, there is a difference in frequency between the clockwise beam and the counterclockwise beam, and the difference is outputted from the output terminal 7 of the optical detector 8 as a beat signal of a change in optical output and thereby the angular speed can be detected.

There has also been proposed such a semiconductor ring laser apparatus as shown in FIG. 2. Referring to this Figure, a semiconductor laser element 10 is connected to a semiconductor laser element driving electric source 12 through a variable resistance 11 for electric current adjustment. A lens 13 is provided, and the other elements correspond to those in FIG. 1 and are denoted by identical members.

This apparatus is also operated in almost the same manner as the apparatus in FIG. 1. Namely, when the apparatus is applied with an angular speed, a difference in frequency between the clockwise and counterclockwise beam is provided from the output terminal 7 of the optical detector 8 as beat signal of a change in optical output. Either of the angular speed detecting ring laser apparatuses shown in FIGS. 1 and 2 is of the type that the clockwise and counterclockwise beams are added together by the optical detector 8 by means of the optical system comprising the beam splitter 3 and the prism 4, and the difference in frequency between the two beams is provided from the optical detector 8 as a beat signal of a change in optical output. Thus, either apparatus of this type requires the optical detector 8, the optical system such as the beam splitter 3, the prism 4 and other elements and requires space for these components. Consequently, the same has the disadvantage that it is high in cost and large in size and weight, and should avoid vibration and change in temperature because the optical system requires an accurate adjustment.

SUMMARY OF THE INVENTION

It is the primary object of the present invention to provide semiconductor ring laser apparatus which is small in size and weight and relatively low in cost.

It is another object of the present invention to provide a semiconductor ring laser apparatus which is relatively insensitive to vibrations and changes in temperature.

The present invention is directed to a semiconductor laser element which is used as a laser element in a ring laser apparatus. The semiconductor laser element is connected to a driving electric source, and it is arranged so that when the apparatus is rotated at a certain angular speed, a beat signal of the difference in frequency between a clockwise beam and a counterclockwise beam is detected as a change in terminal voltage of the semiconductor laser element.

DETAILED DESCRIPTION OF THE PREFERRED EMBODIMENTS

Figure 1:
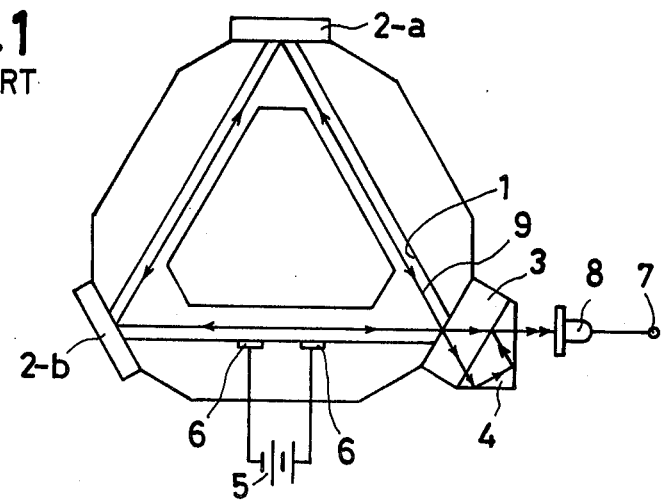
FIGS. 1 and 2 are diagrams of prior art angular speed detecting ring laser apparatus.
Figure 2:
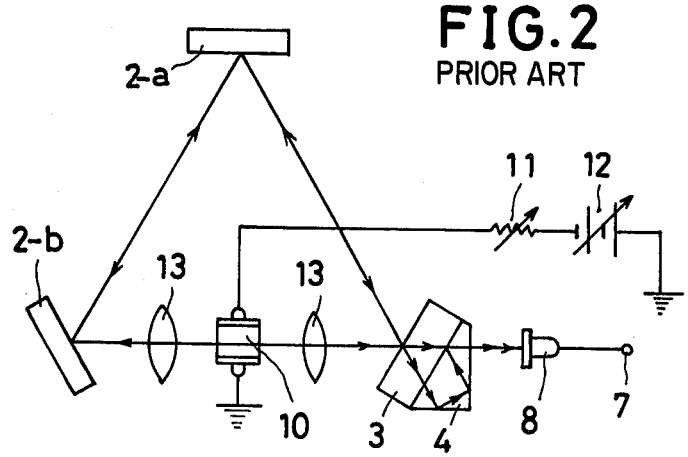
Figure 3:
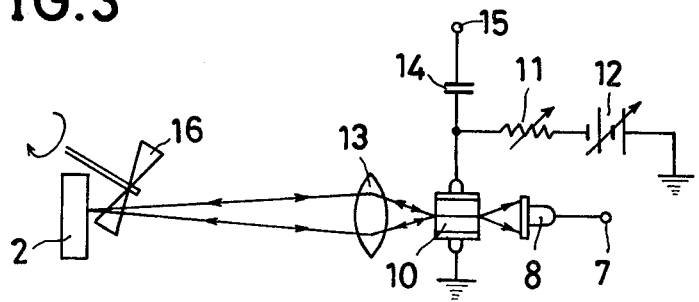
FIG. 3 is a diagram explaining the principle of operation of the present invention.

The phenomenon of the present invention will be illustrated with regards to an experimental apparatus shown in FIG. 3. An output beam from a semiconductor laser element 10 is focused on a mirror 2 through a lens 13, and a reflection beam thereof is blocked and passed repeatedly by rotation of a chopper 16. The reflection beam is thus caused to feed back and not to feed back repeatedly to the semiconductor laser element 10. In this apparatus, when the reflection beam is fed back thereto, the semiconductor laser element 10 is caused to have a self-coupling effect by the feedback beam. Consequently, its optical output, which is detected by the optical detector 8, is increased as compared with the occasion where the element 10 receives no feedback beam. At the same time, the terminal voltage of the semiconductor laser element 10 connected to the driving electric source 12 is changed in accordance with the increase and decrease of the optical output.

When, in FIG. 3, there is a multi-mode oscillation by the self-coupling effect caused by the feedback beam, there often appears on the optical output of the semiconductor laser element oscillations of a higher frequency (inductive oscillation) and, also in this case, there appears on the terminal voltage of the semiconductor laser element an oscillation of the frequency which is equal to that of the optical output oscillation.

An output terminal 15 provides a change in terminal voltage of the semiconductor laser element 10 which can be electrically detected.

Thus, in a semiconductor laser element, if the optical output is changed for a certain reason, the terminal voltage thereof is also changed in accordance with the change thereof. Accordingly, if this phenomenon is utilized, the optical beat signal in the semiconductor laser apparatus can be detected as a change in terminal voltage of the semiconductor laser element itself, instead of the conventional detecting as a change in optical output of an optical detector.

Figure 4:
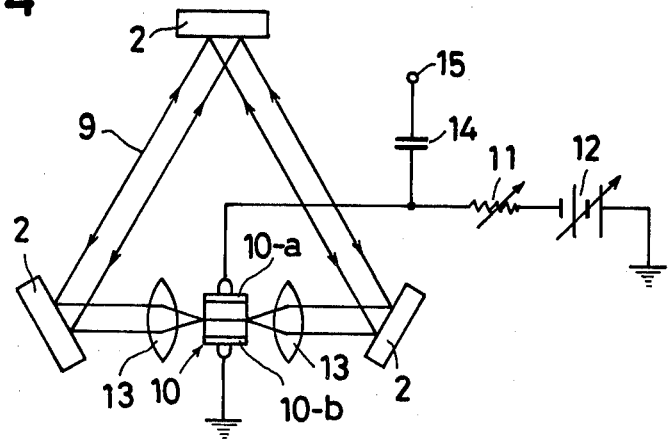
FIG. 4 is a schematic diagram of one embodiment of a semiconductor ring laser of the present invention.

FIG. 4 shows one embodiment of the present invention. A semiconductor laser element 10 is connected at its electrodes 10a, 10b to a driving electric source 12 through a resistance 11. Forward and rearward output beams thereof are formed into a ring-formed optical path by means of lenses 13 and mirrors 2. This apparatus is brought into a ring laser oscillation condition by the ring-formed optical path 9 used as a ring-formed resonator. As a certain angular speed is applied to this apparatus, there is caused a difference in frequency between the clockwise beam and the counterclockwise beam as mentioned before. This difference appears as a heat signal on the optical output of the semiconductor laser element 10, and also appears as a beat signal of the same frequency on the terminal voltage of the semiconductor laser element 10.

Accordingly, this beat signal at terminal 15 can be detected through a direct current blocking capacitor 14.

Figure 5:
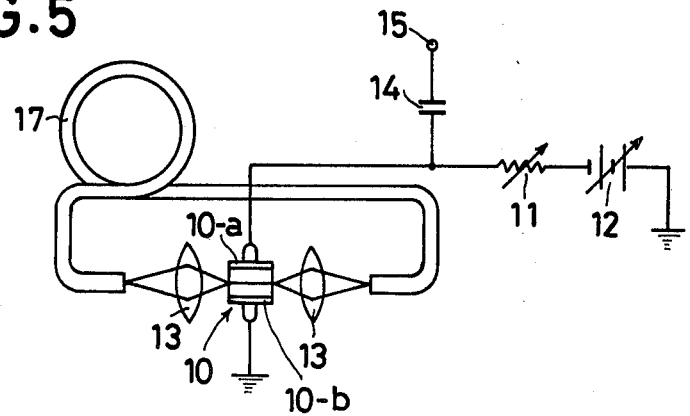
FIG. 5 is a schematic diagram of another embodiment of a semiconductor ring laser of the present invention.
Figure 6:
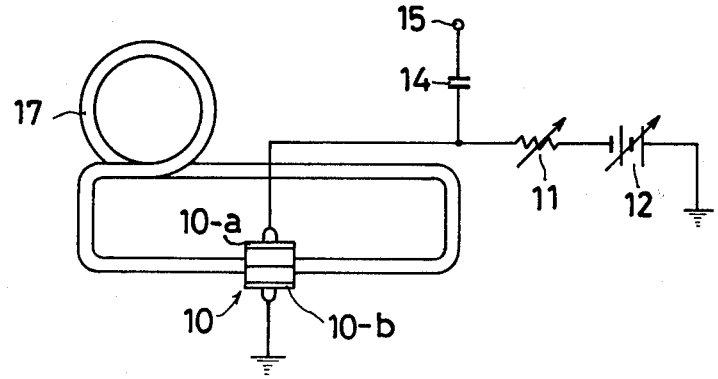
FIG. 6 is a schematic diagram of still another embodiment of a semiconductor ring laser of the present invention.

FIGS. 5 and 6 show further embodiments of this invention. Each of these is a semiconductor ring laser apparatus having an optical fiber member 17 in the ring-formed optical path formed outside the semiconductor laser element 10. In FIG. 5, lenses 13,13 are interposed between the semiconductor laser element 10 and the optical fiber member 17 while, in FIG. 6, the lenses 13,13 are omitted and the semiconductor laser element 10 and the ring-formed optical fiber member 17 are directly connected.

Figure 7A:
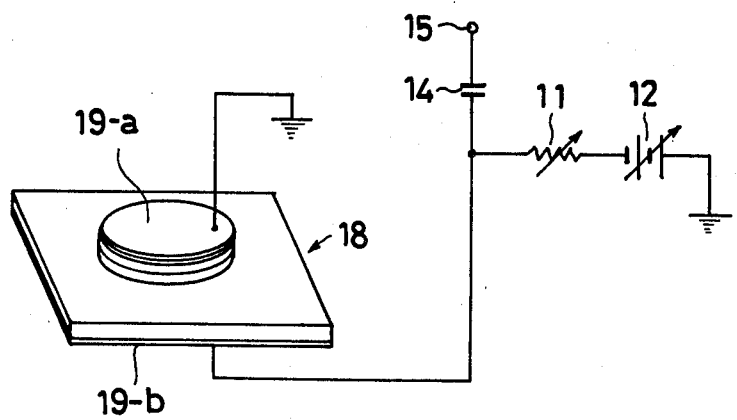
FIGS. 7A and 7B are perspective views of a semiconductor laser element and detecting circuit of the present invention.
Figure 7B:
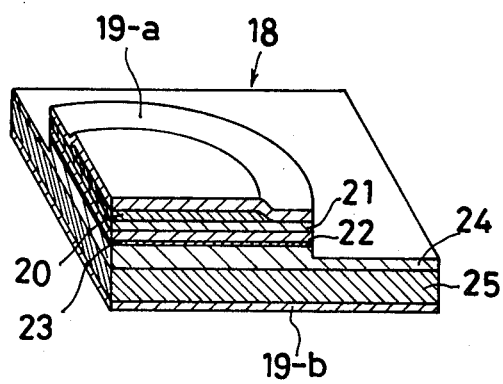

FIG. 7A shows an embodiment of a semiconductor laser element of this invention, and FIGS. 7B shows a partial sectional perspective view of the semiconductor laser element shown in FIG. 7A.

Referring to these Figures, the semiconductor laser element 18 has upper and lower electrodes 19a, 19b and there are interposed between these electrodes 19a,19b an insulation layer 20, a P-type Ga As layer 21, a P-type $Al_XGa$;hd 1−XAs layer 22, an n-type $Al_XGa_{1-X}As$ layer (waveguide) 23, an n-type $Al_XGa_{1-X}As$ layer 24 and an n-type Ga As layer 25 (here X is different in each layer).

The semiconductor laser element 18 is connected at two electrodes 19a, 19b to a driving electric source 12 through a resistance 11 so that a charged electric current may flow from the electrode 19a thereinto in the form of a ring so as to constitute a ring-formed waveguide 23, and thereby ring laser oscillation is effected.

Also in this embodiment, by applying a certain angular speed to the semiconductor ring laser apparatus, there is produced a beat signal of a frequency difference between clockwise and counterclockwise beams which can be detected from the output terminal 15 through the direct current blocking capacitor 14 as a change in terminal voltage of the semiconductor laser element 18.

Thus, according to this invention, when a certain angular speed is applied to the semiconductor ring laser apparatus, a beat signal of a frequency difference between clockwise and counterclockwise beams is detected as a change in terminal voltage of a semiconductor laser element connected to a driving electric source. Thus, the need for an optical detector is eliminated and an optical system comprising a beam splitter, a lens and other members for putting the beams together and an optical path and a space for various parts of the optical system can be abolished. Thus, there can be obtained practical and extremely excellent semiconductor ring laser apparatus which is small in size and weight, low in cost and small in number of parts.

The present invention may be embodied in other specific forms without departing from the spirit or essential characteristics thereof. The presently disclosed embodiments are, therefore, to be considered in all respects as illustrative and not restrictive, the scope of the invention being indicated by the appended claims rather than the foregoing description, and all changes which come within the meaning and range of equivalency of the claims are, therefore, to be embraced therein.

What is claimed:

1. A semiconductor ring laser apparatus for detecting angular rotation comprising:
   (a) a semiconductor laser element having electrical terminals and optical terminals;
   (b) electrical power supply means coupled to said electrical terminals for applying a direct current voltage thereto;
   (c) optical means, optically coupled to said optical terminals of said semiconductor laser element, said optical means forming resonant ring optical paths in clockwise and counterclockwise directions for the light emitted by said semiconductor; and
   (d) detector means coupled to said electrical terminals for detecting only alternating current voltage variations thereon representative of the beat frequency caused by the rotation of said apparatus.

2. A semiconductor ring laser apparatus as set forth in claim 1 wherein said detector means include a direct current blocking capacitor.

3. A semiconductor ring laser apparatus as set forth in claim 1 wherein said optical means comprises a plurality of mirrors positioned with respect to said semiconductor laser element for reflecting the light emitted thereby along said resonant ring optical path.

4. A semiconductor ring laser apparatus as set forth in claim 1 wherein said optical means comprises an optical fiber means shaped to form at least a portion of said resonant ring optical path.

5. A semiconductor ring laser apparatus as set forth in claim 4 wherein said optical fiber means contacts said semiconductor laser element.

* * * * *